United States Patent
Lim et al.

(10) Patent No.: US 7,193,276 B2
(45) Date of Patent: Mar. 20, 2007

(54) SEMICONDUCTOR DEVICES WITH A SOURCE/DRAIN REGIONS FORMED ON A RECESSED PORTION OF AN ISOLATION LAYER

(75) Inventors: Hoon Lim, Seoul (KR); Soon-Moon Jung, Gyeonggi-do (KR); Won-Seok Cho, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/967,374

(22) Filed: Oct. 18, 2004

(65) Prior Publication Data

US 2005/0106838 A1    May 19, 2005

(30) Foreign Application Priority Data

Nov. 17, 2003    (KR) .................... 10-2003-0081078

(51) Int. Cl.
    *H01L 29/76* (2006.01)
(52) U.S. Cl. ................ 257/368; 257/399; 257/E21.431
(58) Field of Classification Search ................ 257/368, 257/399, 519, 556, E21.431, E21.619, 268; 438/300

See application file for complete search history.

(56) References Cited

U.S. PATENT DOCUMENTS

| 4,789,644 | A | * | 12/1988 | Meda | 438/300 |
| 5,079,108 | A | * | 1/1992 | Annen et al. | 429/171 |
| 5,272,365 | A | * | 12/1993 | Nakagawa | 257/194 |
| 2002/0135020 | A1 | * | 9/2002 | Skotnicki et al. | 257/368 |
| 2004/0053457 | A1 | * | 3/2004 | Sohn | 438/197 |

* cited by examiner

*Primary Examiner*—Brook Kebede
(74) *Attorney, Agent, or Firm*—Myers Bigel Sibley & Sajovec PA (57) ABSTRACT

Semiconductor devices and methods of fabricating semiconductor devices that include a substrate and a device isolation layer in the substrate that defines an active region of the substrate are provided. The device isolation layer has a vertically protruding portion having a sidewall that extends vertically beyond a surface of the substrate. An epitaxial layer is provided on the surface of the substrate in the active region and extends onto the device isolation layer. The epitaxial layer is spaced apart from the sidewall of the vertically protruding portion of the device isolation layer. A gate pattern is provided on the epitaxial layer and source/drain regions are provided in the epitaxial layer at opposite sides of the gate pattern.

23 Claims, 8 Drawing Sheets

Fig. 1

(Prior Art)

SEMICONDUCTOR DEVICES WITH A SOURCE/DRAIN REGIONS FORMED ON A RECESSED PORTION OF AN ISOLATION LAYER

CLAIM OF PRIORITY

This application claims priority from Korean Patent Application No. 2003-081078, filed on Nov. 17, 2003, in the Korean Intellectual Property Office, the contents of which are hereby incorporated by reference in their entirety as if set forth fully herein.

FIELD OF THE INVENTION

The present invention relates to semiconductor devices and methods of fabricating the same, and specifically, to semiconductor devices with a source/drain formed on an isolation layer and methods of fabricating the same.

BACKGROUND OF THE INVENTION

Integrated circuit semiconductor devices may include combinations of transistors having differing characteristics to satisfy a user's particular application. The transistors typically have differing characteristics depending on their function and may be formed in several structures to provide the desired characteristic.

As a particular example, to provide high-integration memory cell arrays, the dimensions of transistors have been reduced. As transistors become smaller, short-channel effects (e.g., a sub-threshold swing or punch-through) may become more frequent or problematic. In order to reduce or prevent punch-through caused by an extension of a depletion region and/or leakage current through the source/drain junction of transistors, transistors on SOI (Silicon-On-Insulator) substrates have been suggested.

Figure 1:
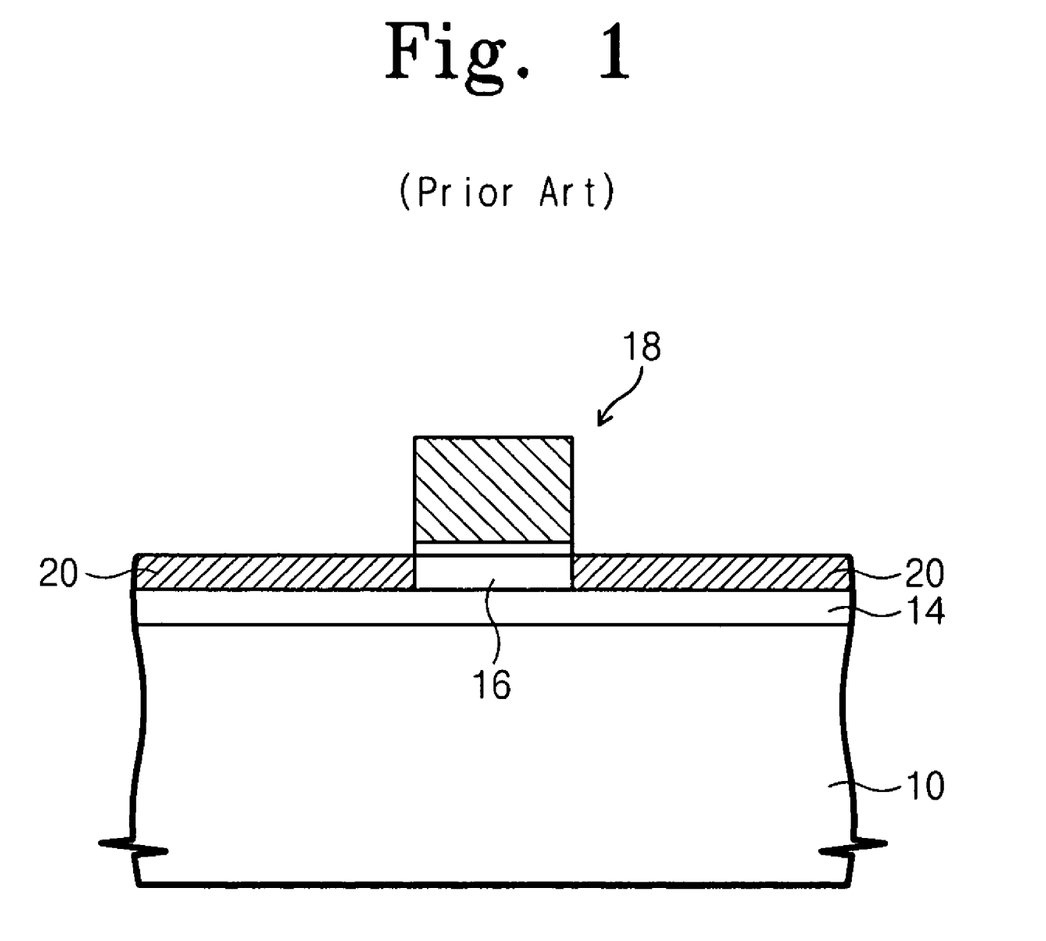
FIG. 1 is a cross-sectional view illustrating a conventional silicon-on-insulator semiconductor device.

FIG. 1 is a cross-sectional view showing a structure of a conventional transistor formed on an SOI (Silicon-On-Insulator) substrate. Referring to FIG. 1, the SOI substrate includes a silicon substrate 10, a buried oxide 14 on the silicon substrate 10 and an SOI layer 16 formed on the buried oxide 14. A gate pattern 18 is formed over the SOI layer 16, and source/drain region 20 is formed in the SOI layer 16 at both sides of the gate pattern 18. If the junction depth of the source/drain region 20 and the thickness of the SOI layer 16 are adequately controlled, the source/drain region 20 is isolated in the SOI layer 16. As shown in FIG. 1, because the junction of the source/drain 20 is in contact with the buried oxide 14, it is possible to isolate a leakage current path and to reduce or even prevent a depletion region from being extended. In addition, a transistor may be fully isolated by the buried oxide 14 and a device isolation layer, which may reduce the occurrence of or even prevent latch-up in a CMOS structure.

However, in the conventional transistor structure formed on the SOI substrate as illustrated in FIG. 1, it may be difficult to disperse Joule heating generated by drain voltage and current. Furthermore, it may also be difficult to reduce floating body effect where a threshold voltage of the transistor varies as a result of the storage of charge in an isolated SOI layer. These problems may result in the transistor not operating as desired or suffering physical damage.

SUMMARY OF THE INVENTION

Some embodiments of the present invention provide semiconductor devices and methods of fabricating semiconductor devices that include a substrate and a device isolation layer in the substrate that defines an active region of the substrate. The device isolation layer has a vertically protruding portion having a sidewall that extends vertically beyond a surface of the substrate. An epitaxial layer is provided on the surface of the substrate in the active region and extends onto the device isolation layer. The epitaxial layer is spaced apart from the sidewall of the vertically protruding portion of the device isolation layer. A gate pattern is provided on the epitaxial layer and source/drain regions are provided in the epitaxial layer at opposite sides of the gate pattern.

In further embodiments of the present invention, the active region of the substrate has a sidewall that protrudes beyond a top surface of a portion of the device isolation layer adjacent the active region.

In some embodiments of the present invention, the source/drain regions are provided on the active region and the device isolation layer such that an area of a portion of the source/drain regions on the device isolation layer is greater than an area of a portion of the source/drain regions on the active region. In further embodiments of the present invention, the source/drain regions are provided only on the device isolation layer. The source/drain regions may also be provided on the active region and the device isolation layer such that an area of a portion of the source/drain regions on the device isolation layer is smaller than an area of a portion of the source/drain regions on the active region.

In additional embodiments of the present invention, the active region includes an upper portion and a lower portion. A width of the upper portion is less than a width of the lower portion such that the active region has stepped sidewalls. The active region may also include an upper portion and a lower portion that provide a hetero-junction therebetween. The device isolation layer may extend onto the lower portion of the active region to a sidewall of the upper portion of the active region. The sidewall of the upper portion of the active region may protrude beyond a top surface of the device isolation layer adjacent the upper portion of the active region.

In still other embodiments of the present invention, semiconductor devices and methods of fabrication of semiconductor devices include a substrate having first and second regions, a first device isolation layer on the substrate that defines a first active region in the first region and has a vertically protruding portion, a second device isolation layer on the substrate that defines a second active region in the second region and has a vertically protruding portion, a first epitaxial layer on the first active region and the first device isolation layer and that is spaced apart from a sidewall of the vertically protruding portion of the first device isolation layer, a second epitaxial layer on the second active region and the second device isolation layer and that is spaced apart from a sidewall of the vertically protruding portion of the first device isolation layer, a first gate pattern disposed to cross over the first epitaxial layer at the first region, a second gate pattern disposed to cross over the second epitaxial layer at the second region, first source and drain regions in the first epitaxial layer at opposite sides of the first gate pattern on the first device isolation layer adjacent to the first active region and second source and drain regions in the second epitaxial layer at opposite sides of the second gate pattern and that extend over the second active region and the second device isolation layer adjacent to the second active region are provided. An area of portions of the second source and drain regions on the second active region is greater than an area of portions of the second source and drain regions on the second device isolation layer. In certain embodiments of the present invention, the first source and drain regions are provided only on the first device isolation layer.

In additional embodiments of the present invention, the first and second active regions of the substrate have sidewalls that protrude beyond a top surface of a portion of the respective first and second device isolation layer adjacent the first and second active regions. The first source and the first drain regions may be provided on the first active region and the first device isolation layer such that an area of a portion of the first source and drain regions on the first device isolation layer is greater than an area of a portion of the first source and drain regions on the first active region.

In still further embodiments of the present invention, the first and second active regions each include an upper portion and a lower portion. A width of the upper portion is less than a width of the lower portion Such that the first and second active regions have stepped sidewalls. The upper portion and the lower portion may provide a hetero-junction therebetween. The first and second device isolation layers may extend onto the lower portion of the respective first and second active regions to a sidewall of the upper portion of the first and second active regions. The sidewalls of the upper portion of the first and second active regions may protrude beyond a top surface of the respective first and second device isolation layers adjacent the upper portion of the first and second active regions.

In yet additional embodiments of the present invention, semiconductor devices and methods of fabricating semiconductor devices that include a substrate and a device isolation layer in the substrate that defines an active region of the substrate are provided. The device isolation layer extends beyond a surface of the substrate and has a recess adjacent the active region that extends to a depth greater than a distance that the device isolation layer extends beyond the surface of the substrate. An epitaxial layer is provided on the surface of the substrate in the active region and extending onto the recess in the device isolation layer, the epitaxial layer being spaced apart from at least a portion of a sidewall of the recess. A gate pattern is provided on the epitaxial layer. A source region and a drain region are provided in the epitaxial layer at opposite sides of the gate pattern.

In some embodiment of the present invention, the gate pattern is substantially a same width as the active region. In further embodiments of the present invention, the source region and the drain region are provided in portions of the epitaxial layer on the device isolation layer. The source and drain regions may be provided only in portions of the epitaxial layer on the device isolation layer. Portions of the source region and the drain region may be provided in portions of the epitaxial layer on the active region of the substrate. The portions of the source region and the drain region provided in portions of the epitaxial layer on the active region may have a smaller area than portions of the source region and the drain region provided in portions of the epitaxial layer on the device isolation layer. The portions of the source region and the drain region provided in portions of the epitaxial layer on the active region may have a larger area than portions of the source region and the drain region provided in portions of the epitaxial layer on the device isolation layer.

In additional embodiments of the present invention, the active region includes an upper portion and a lower portion. The upper portion and the lower portion may be different semiconductor materials and provide a heterojunction. The upper portion may have a smaller dimension than the lower portion so as to provide a step between a sidewall of the lower portion and a sidewall of the upper portion. The device isolation layer may extend onto the step of the lower portion to the sidewall of the upper portion. The source and drain regions may extend into the upper portion of the active region.

In further embodiments of the present invention, the epitaxial layer has a thickness and wherein the epitaxial layer extends laterally onto the recess a distance corresponding to the thickness of the epitaxial layer.

DETAILED DESCRIPTION OF THE INVENTION

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout the specification.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
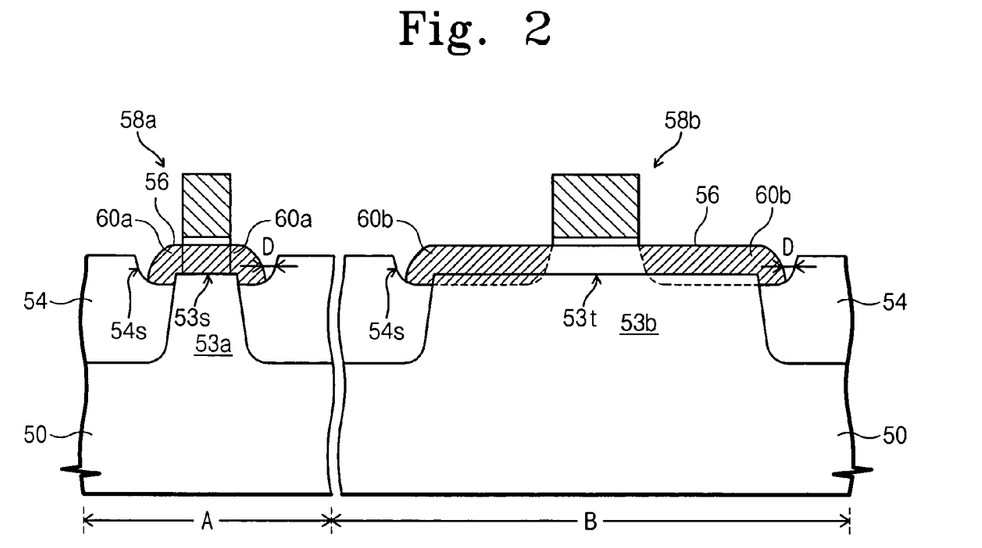
FIG. 2 is a cross-sectional view illustrating semiconductor devices according to some embodiments of the present invention.

FIG. 2 is a cross-sectional view illustrating semiconductor devices according to some embodiments of the present invention. Referring to FIG. 2, the semiconductor device includes first and second regions A and B where transistors with different driving characteristics are provided. Transistors for which short-channel effect is a concern are formed in the first region A. For example, region A may correspond to a cell array region of a memory device. In the second region B, transistors having relatively large dimensions and high driving capacity may be provided. In the second region B, transistors may be provided where Joule heating dispersion and floating-body effect may be concerns, rather than short-channel effects. For example, a high voltage or high current driving transistor of a memory device and/or a high-frequency and/or power transistor of a logic circuit may be formed in the second region B.

A device isolation layer 54 is formed on a semiconductor substrate 50 to define a first active region 53a in the first region A. The device isolation layer 54 has a protruding portion having a sidewall 54s and that extends vertically beyond a first surface 53s of the first active region 53a and provides a recess adjacent the first active region 53a. An epitaxial layer 56 is formed on the first surface 53s of the first active region 53a. The epitaxial layer 56 has a portion that extend from the first active region 53a onto the device isolation layer 54. A sidewall of the epitaxial layer 56 is spaced a distance D from the sidewall 54s of the protruding portion of the device isolation layer 54. In particular embodiments of the present invention, the distance D is sufficiently large so as to reduce and/or minimize stress caused by the formation of the epitaxial layer 56 on the device isolation layer 54. The distance D should also be large enough to provide isolation of the epitaxial layer from the sidewall 54s of the device isolation layer 54, for example, taking into account manufacturing tolerances. However, in some embodiments of the present invention, the distance D is not so large as to significantly increase the overall size of the devices.

A first gate pattern 58a is disposed crossing over the epitaxial layer 56. A first source/drain region 60a is formed in the epitaxial layer 56 at both sides of the first gate pattern 58a. In order to reduce or even minimize punch-through due to extension of a depletion region of the first source/drain 60a and junction leakage current, in some embodiments of the present invention, the lower junction of the first source/drain 60a contacts only the device isolation layer 54. Accordingly, in some embodiments of the present invention, the width of the first gate pattern 58a is the same as or wider than that of the first active region 53a.

In embodiments of the present invention where the lower junction of the first source/drain 60a contacts the active region 53a and the device isolation layer 54, the first source/drain 60a may still suppress punch-through resulting from an extension of a depletion region. For example, punch-through may still be suppressed if the dimension of the portion of the first source/drain 60a on the device isolation layer 54 is larger than the dimension of portion of the first source/drain 60a on the first active region 53a. In this case, a part of the first source/drain 60a may be formed on the first active region 53a and the first active region 53a has a sidewall that extends past a top surface of the device isolation layer 54 adjacent the first active region 53a. Because the epitaxial layer 56 is grown on a sidewall of the first active region 53a, the thickness of the epitaxial layer 56 may be uniform vertically and laterally. If the epitaxial layer 56 is in contact with the sidewall 54s of the protruding portion of the device isolation layer 54, a defect due to stress may arise near the contact portion. As a result, this may induce leakage current in the transistor. Therefore, in some embodiments of the present invention, the sidewall of the epitaxial layer 56 is spaced apart a distance D from the protruding sidewall 54s of the isolation layer 54.

As is further illustrated in FIG. 2, a transistor may also be formed in a wide active region of the second region B. Accordingly, transistors having a relatively high current driving capacity may be formed on the second region B. A device isolation layer 54 is formed on the second region B to define a second active region 53b. The device isolation layer 54 has a protruding portion that extends vertically beyond a first surface 53t of the second active region 53b and provides a recess adjacent the first active region 53b. An epitaxial layer 56 is formed on the first surface 53t of the second active region 53b. The epitaxial layer 56 has a portion that extends onto the device isolation layer 54 that defines the second active region 53b. A sidewall of the epitaxial layer 56 is spaced a distance D apart from a vertical sidewall 54s of the vertically protruding portion of the device isolation layer 54. A second gate pattern 58b is formed on the epitaxial layer 56, and a second source/drain 60b is formed in the epitaxial layer 56 at both sides of the second gate pattern 58b.

To efficiently disperse Joule heating generated in operating a transistor, in some embodiments of the present invention, the second active region 53b is wider than a channel of the transistor. Accordingly, in some embodiments of the present invention, the dimension of the second active region 53b is larger than that of the second gate pattern 58b. Furthermore, a part of the second source/drain 60b may be formed in the second active region 53b.

Figure 3:
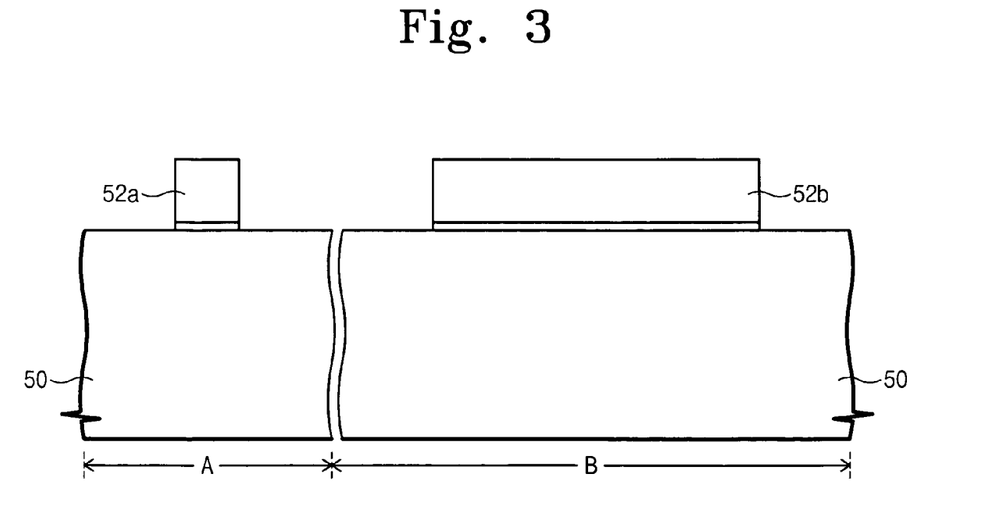
FIGS. 3 to 8 are cross-sectional views illustrating methods of fabricating semiconductor devices according to some embodiments of the present invention.

FIGS. 3 to 8 are cross-sectional views illustrating methods of fabricating semiconductor devices according to some embodiments of the present invention. Referring to FIG. 3, first and second mask patterns 52a and 52b are formed on first and second regions A and B, respectively, of the substrate 50. The first and second mask patterns 52a and 52b may include silicon nitride.

Figure 4:
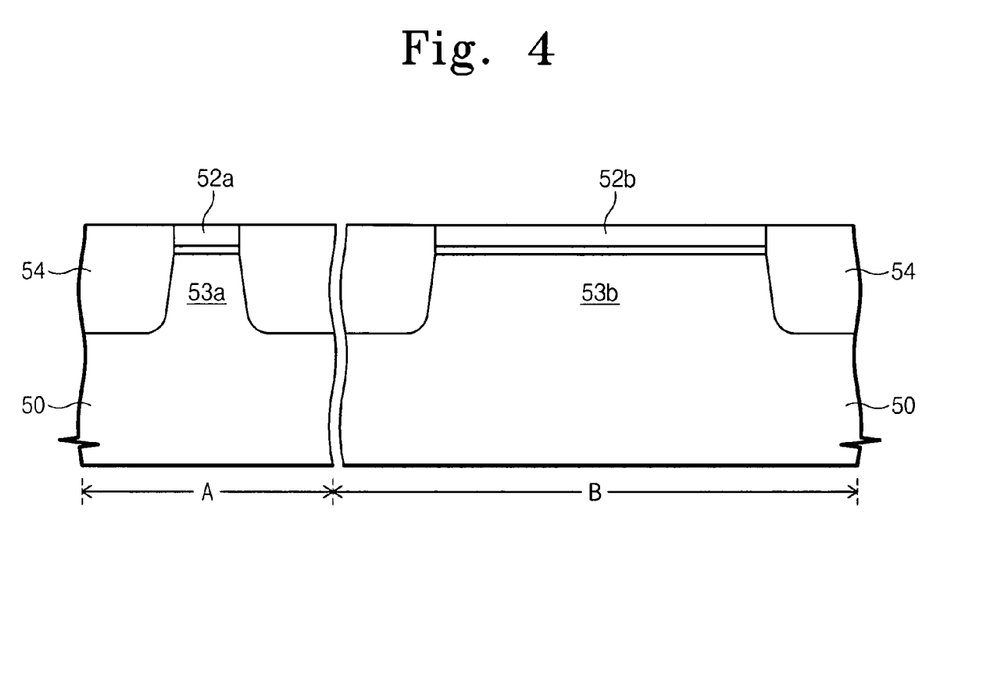

Referring to FIG. 4, trenches respectively defining the first and second active regions 53a and 53b on the first and second regions A and B are formed using the first and second mask patterns 52a and 52b as etching masks. An insulation layer is formed in the trenches to form device isolation layers 54 in the first and second regions A and B. The device isolation layers 54 may be formed in, and in some embodiments, to fill the trenches. In some embodiments, the device isolation layers 54 are formed after a thermal oxide and a silicon nitride liner are formed on inner walls of the trenches. The device isolation layers 54 have an upper sidewall in contact with the first and second mask patterns 52a and 52b.

Figure 5:
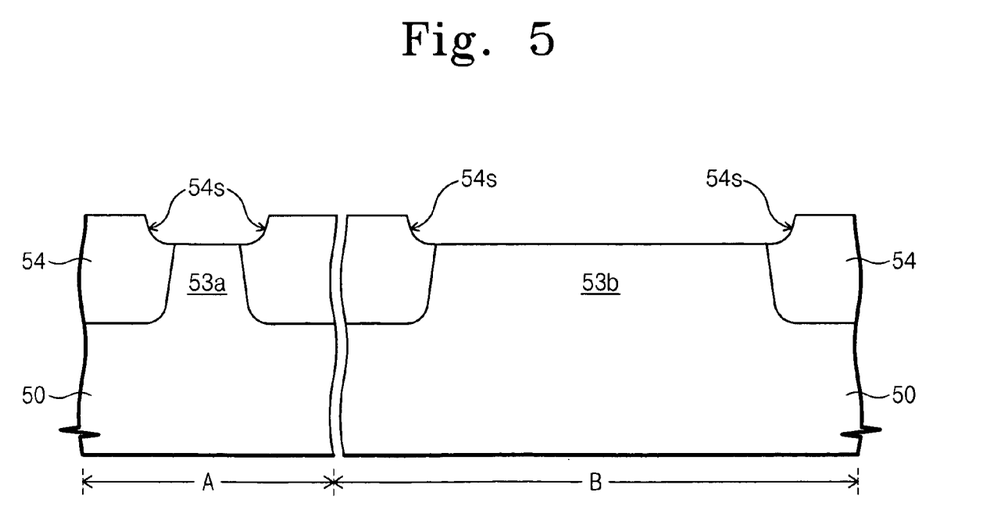

Referring to FIG. 5, the first and second mask patterns 52a and 52b are removed. The device isolation layers 54 may have an upper sidewall 54s that protrudes from the top surface of the substrate 50. The upper sidewall 54s of the device isolation layers 54 may be recessed laterally during a sacrificial oxidation process or a cleaning process.

Figure 6:
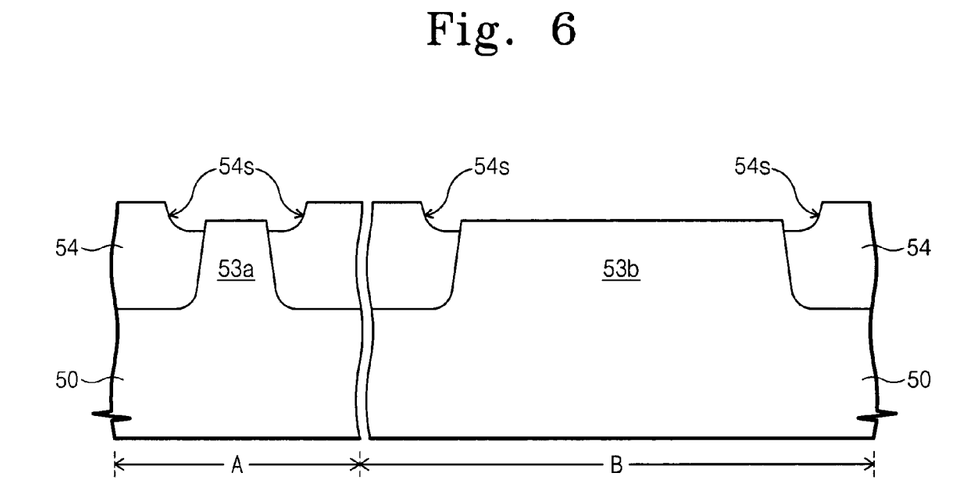

Referring to FIG. 6, the device isolation layers 54s are recessed to partially expose a portion of the sidewalls of the first and second active regions 53a and 53b. The device isolation layers 54 may be recessed using an isotropic etching process. The protruding sidewall 54s is laterally recessed to provide a space between boundaries of the active region and the protruding sidewall 54 of the device isolation layer.

Figure 7:
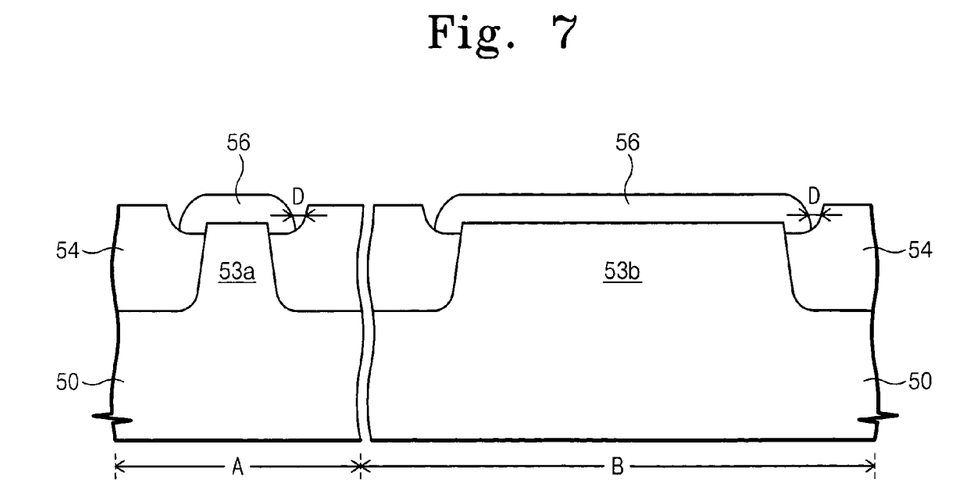

Referring to FIG. 7, epitaxial layers 56 are formed on the first and second active regions 53a and 53b using a selective epitaxial growth method. The epitaxial layers 56 are grown upward and laterally on the first and second active regions 53a and 53b. The epitaxial layers 56 extend laterally to an upper portion of the isolation layers 54 adjacent the active regions 53a and 53b. Thus, the epitaxial layers 56 grown in the direction of the protruding sidewalls 54s of the device isolation layers 54. If a growth interface of an epitaxial layer 56 is in contact with a protruding sidewall 54s of the device isolation layer 54, a defect due to compressive stress may result. Accordingly, in some embodiments of the present invention, the epitaxial layer is spaced apart from the protruding sidewall 54s, for example, a distance D may be provided between the protruding sidewall 54s of the device isolation layer 54 and the epitaxial layer 56.

In some embodiments, a ratio of the dimension of the portion of the epitaxial layer that extends onto the isolation layer and the total dimension of the epitaxial layer is inverse to the dimension of an active region. Therefore, the desired characteristics and, therefore, the dimensions, of a transistor should be taken into account in defining a location of the first and second active regions 53a and 53b. In other words, an active region with a small dimension may be defined in a region where transistors requiring the suppression of short-channel effect will be formed. An active region with a large dimension may be defined in a region where transistors requiring Joule heating dispersion and suppression of floating-body effect will be formed.

Figure 8:
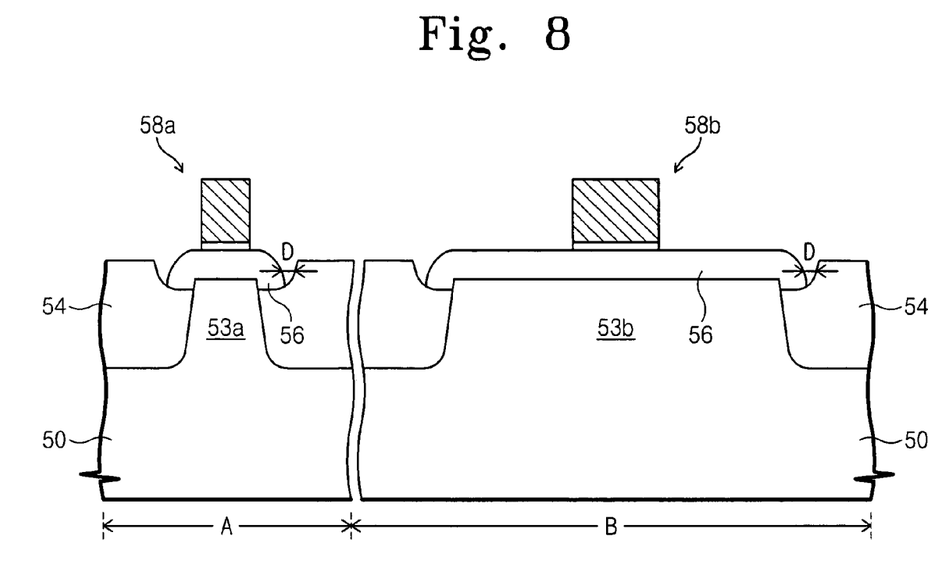

Referring to FIG. 8, a first gate pattern 58a crossing over an epitaxial layer 56 of the first region A is formed, and a second gate pattern 58b crossing over an epitaxial layer 56 of the second region B is formed. In some embodiments, the width of the first gate pattern 58a is the same as or wider than that of the first active region 53a. The width of the second gate pattern 58b may be narrower than that of the second active region 53b. The width of gate patterns is closely related with characteristics of the transistor. Accordingly, the first active region 53a may be defined narrower than the first gate pattern 58a, and the second active region 53b may be defined wider than the second gate pattern 58b.

Impurities are implanted into epitaxial layer 56 on both sides of the first and second gate patterns 58a and 58b to form first and second source/drains (see 60a and 60b in FIG. 2). To suppress short-channel effects, in some embodiments of the present invention, a lower junction of the first source/drain (see 60b in FIG. 2) only contacts the device isolation layer 54, and/or a region of the first source/drain on the device isolation layer 54 is wider than a region of the first source/drain on the first active region 53a. In addition, in some embodiments, to improve Joule heat dispersion and suppress floating-body effect, an upper region of second source/drain on the second active region 53b is wider than the region of the second source/drain on the device isolation layer 54 (see 60b in FIG. 2).

Operational characteristics of transistors typically depend on dimensions of the source/drain regions and the width and length of the gate pattern. Accordingly, in view of the dimensions of the source/drain regions and the width and length of the gate pattern, the dimensions of the first and second active regions 53a and 53b and the dimensions of the extension of the epitaxial layer 56 onto the device isolation layer 54 can be defined. As a result, it is possible to respectively control a ratio of a region of the first and second source/drains (see 60a and 60b in FIG. 2) on the device isolation layer 54.

Figure 9:
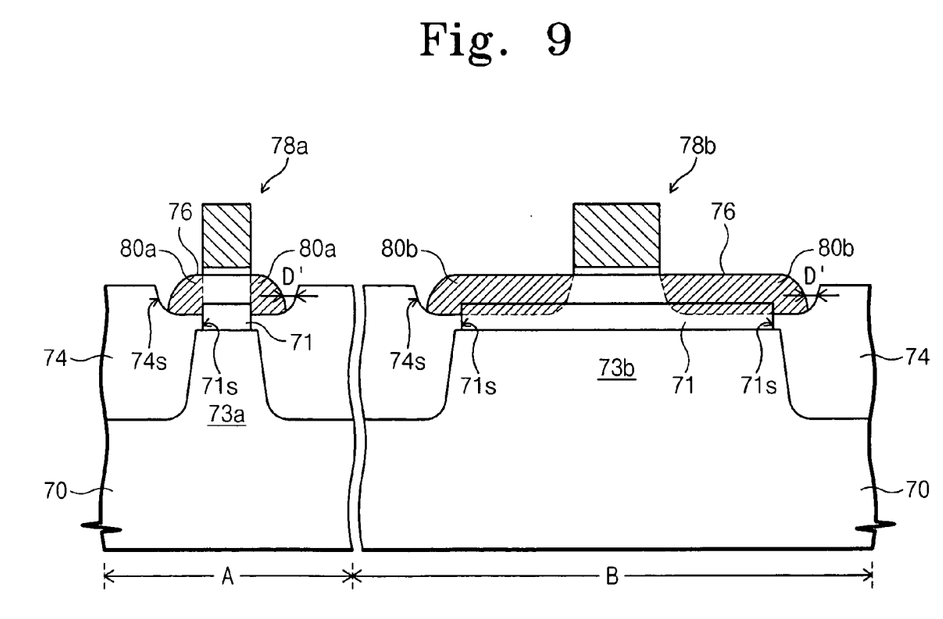
FIG. 9 is a cross-sectional view illustrating semiconductor devices according to further embodiments of the present invention.

FIG. 9 is a cross-sectional view illustrating semiconductor devices according to further embodiments of the present invention. Referring to FIG. 9, semiconductor devices according to further embodiments of the present invention may include first and second regions A and B, at which transistors with different driving characteristics may be formed. In the first region A, transistors that may be affected by short-channel effects may be formed. For example, a cell array region of a memory device may correspond to the first region A. In the second region B, transistors having a relatively high current driving capacity may be formed. In this case, the transistors may be affected by Joule heat dispersion and floating-body effects rather than short-channel effects. For example, a high-voltage or current driving transistor of the memory device or a high-frequency or power transistor of a logic circuit may be formed on the second region B.

A device isolation layer 74 is formed on a semiconductor substrate 70 to respectively define first and second active regions 73a and 73b on the first and second regions A and B. The first and second active regions 73a and 73b have stepped sidewalls at which the width of the upper portion is narrower than that of the lower portion. If upper and lower portions of the first and second active regions 73a and 73b are formed with different semiconductors, the stepped sidewalls may be formed in a fabricating process for the different semiconductors. For example, lower portions of the first and second active regions 73a and 73b may be a silicon substrate 70, and upper portions of the first and second active regions 73a and 73b may be silicon-germanium 71. Accordingly, the first and second active regions 73a and 73b are divided into an upper portion and a lower portion having a heterojunction.

The device isolation layer 74 has a protruding portion that extends vertically past the top surface of the first and second active regions 73a and 73b and provides a recess adjacent the first and second active regions 73a and 73b. The sidewall of the device isolation layer 74 extends along a sidewall of the active region and is in contact with an upper sidewall 71s of the respective active regions 73a and 73b.

Epitaxial layers 76 are formed on the first and second active regions 73a and 73b. The epitaxial layers 76 have a portion extended onto an upper portion of the adjacent device isolation layer 74. First and second gate patterns 78a and 78b are disposed crossing over the respective epitaxial layers 76 on the first and second regions A and B. A first source/drain 80a is formed in the epitaxial layer 76 at both sides of the first gate pattern 78a and a second source/drain 80b is formed in the epitaxial layer 76 at both sides of the second gate pattern 78b.

To reduce or even minimize junction leakage current of the first source/drain 80a and punch-through by an extension of a depletion region, in some embodiments of the present invention, a lower junction of the first source/drain 80a contacts only the device isolation layer 74. Therefore, the width of the first gate pattern 78a may be the same as or wider than that of the first active region 73a. However, in some embodiments of the present invention where the lower junction of the first source/drain 80a contacts more than the device isolation layer 74, the first source/drain 80a can sufficiently suppress punch-through due to an extension of an extension of depletion region and leakage current by the dimension of the portion of the first source/drain 80a on the device isolation layer 74 being larger than the dimensions of the portion of the first source/drain 80a on the first active region 73a. In this case, a part of the first source/drain 80a may be formed in the semiconductor layer 71 of the first active region 73a.

To efficiently disperse Joule heat generated in operating a transistor, in some embodiments of the present invention, the second active region 73b may be wider than a channel of the transistor. Accordingly, the dimensions of the second active region 73b may be larger than that of the second source/drain 80b. A part of the second source/drain 80b may be formed in the semiconductor layer 71 of the second active region 73b.

The first and second active regions 73a and 73b may have an upper sidewall protruding from the adjacent device isolation layer 74. Because the epitaxial layer 76 is grown on the protruding sidewall, its thickness may be uniform vertically and laterally. If the epitaxial layer 76 is in contact with the vertically protruding sidewall of the device isolation layer, a defect due to stress may arise near the contact portion. As a result, this may induce leakage current in the transistor. Therefore, in some embodiments of the present invention, the sidewall of the epitaxial layer 76 is isolated at a distance D' from the vertically protruding sidewall 74s of the adjacent isolation layer 74.

Figure 10:
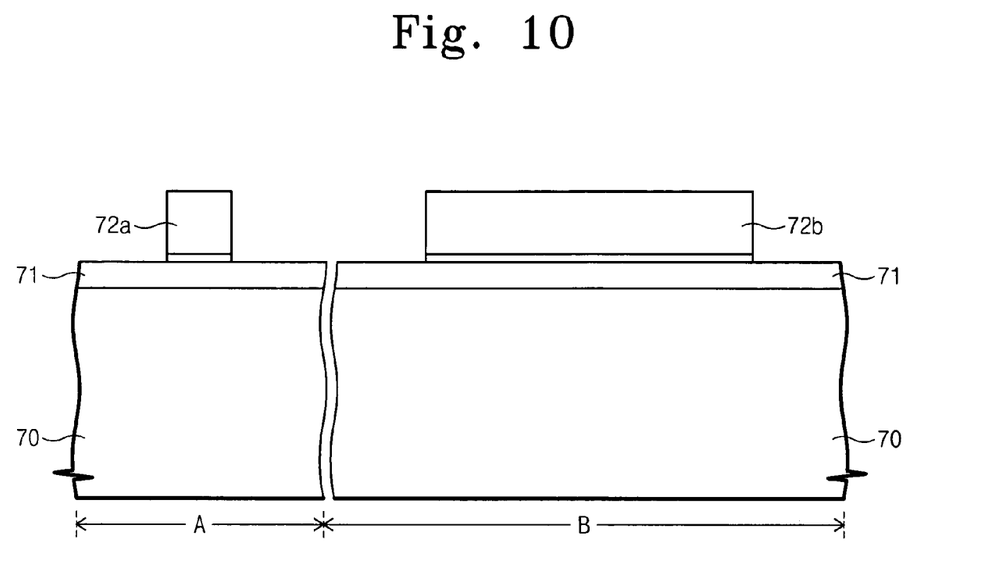
FIGS. 10 to 15 are cross-sectional views illustrating methods of fabricating semiconductor devices according to further embodiments of the present invention.

FIGS. 10 to 15 are cross-sectional views illustrating methods of fabricating semiconductor devices according to further embodiments of the present invention. Referring to FIG. 10, a semiconductor layer 71 having an etch selectivity with respect to a substrate 70 is formed. First and second regions A and B are defined on the substrate 70. First and second mask patterns 72a and 72b are formed on the semiconductor layer 71. The first and second mask patterns 72a and 72b may include silicon nitride. The semiconductor substrate 70 may be a silicon substrate. The semiconductor layer 71 has an etch selectivity with respect to silicon and, for example, may be formed of silicon-germanium. Silicon-germanium has a high etch rate in comparison with silicon in an isotropic or anisotropic etching process.

Figure 11:
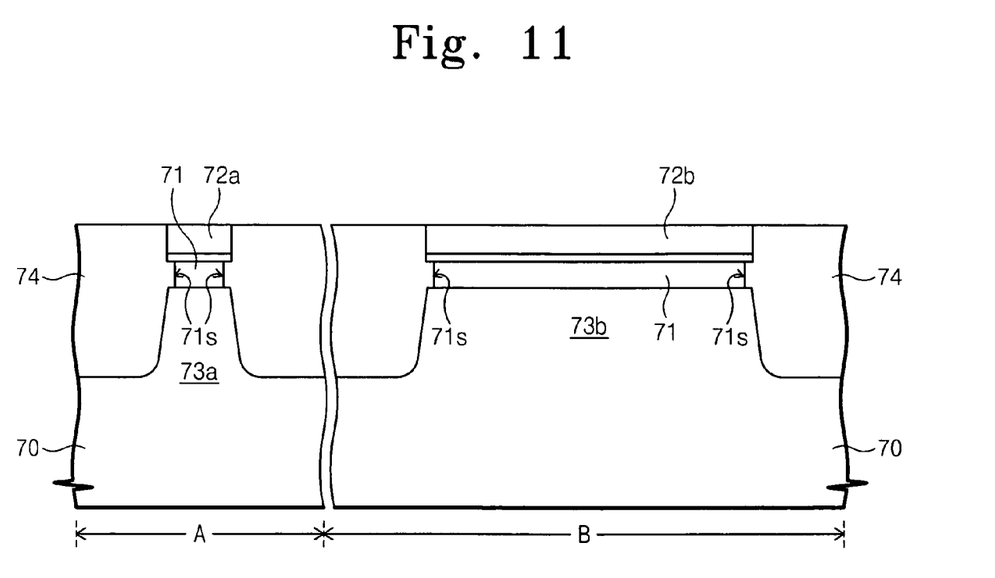

Referring to FIG. 11, trenches that respectively define the first and second active regions 73a and 73b on the first and second regions A and B are formed using the first and second mask patterns 72a and 72b as an etching mask. While the trench is formed, sidewalls 71s become recessed. As a result, the trench has an under-cut region under the first and second mask patterns 72a and 72b. Accordingly, the first and second active regions 73a and 73b are divided into an upper portion and a lower portion, and have stepped sidewalls at the heterojunction between the substrate 70 and the semiconductor layer 71. An insulation layer is provided in the trench and, in some embodiments, fills the trench to form device isolation layers 74 on the first and second regions A and B. The device isolation layers 74 may be formed by filling the trench with an insulation layer after a thermal oxide layer and a silicon nitride liner are formed in the trench. The device isolation layers 74 extend into and, in some embodiments, fill in the under-cut region located under the first and second mask patterns 72a and 72b. As a result, the device isolation layers 74 have upper sidewalls whose shape is along the upper sidewalls of the mask patterns 72a and 72b and the active regions 73a and 73b.

Figure 12:
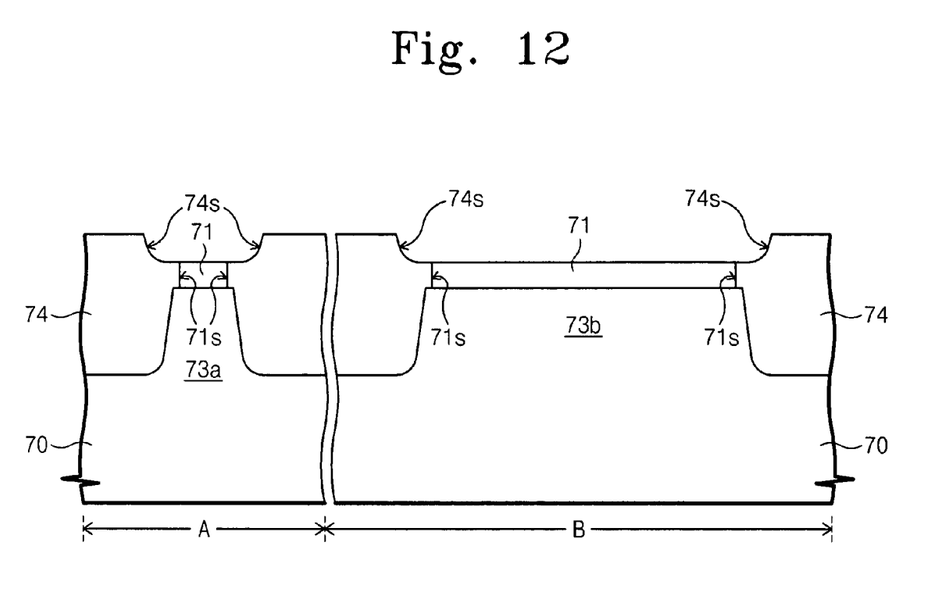

Referring to FIG. 12, the first and second mask patterns 72a and 72b are removed. An upper sidewall 74s of the device isolation layers 74 protrudes from the semiconductor layer 71. The upper sidewall 74s of the device isolation layers 74 may be recessed laterally by a sacrificial oxidation and/or cleaning processes. Because the under-cut region is formed under the first and second mask patterns 72a and 72b, an upper portion of the device isolation layer 74 can be divided into a horizontal portion corresponding to the portion extending into the undercut and a vertical portion corresponding to the portion that protrudes vertically.

Figure 13:
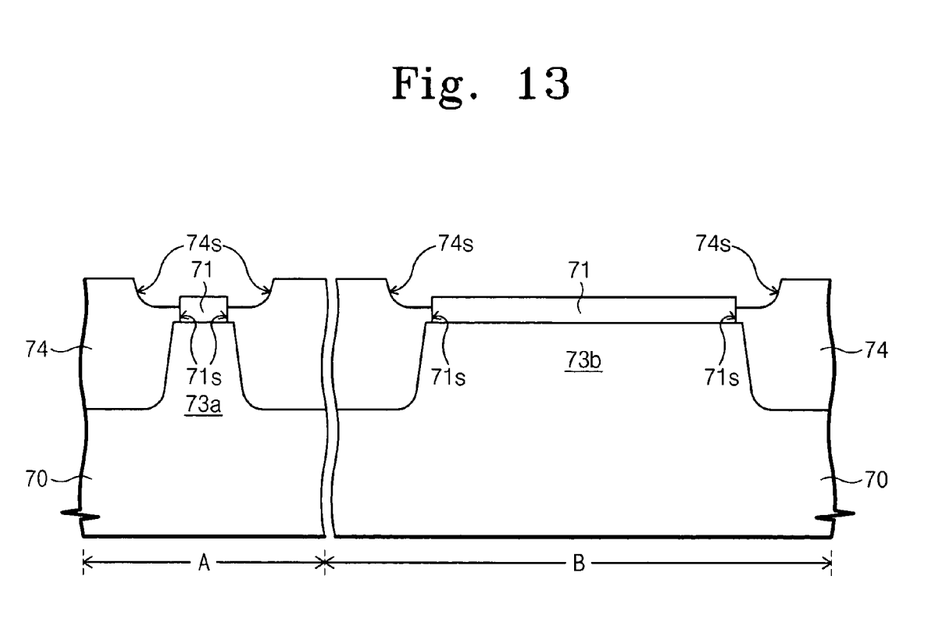

Referring to FIG. 13, a part of the sidewalls of the first and second active regions 73a and 73b may be further exposed by recessing the device isolation layers 74. The device isolation layers 74 may be recessed by an isotropic etch process. The protruding sidewall 74s is recessed laterally so that a predetermined distance is provided at the boundaries of the active regions 73a and 73b and the protruding sidewalls 74s of the device isolation layers 74.

Figure 14:
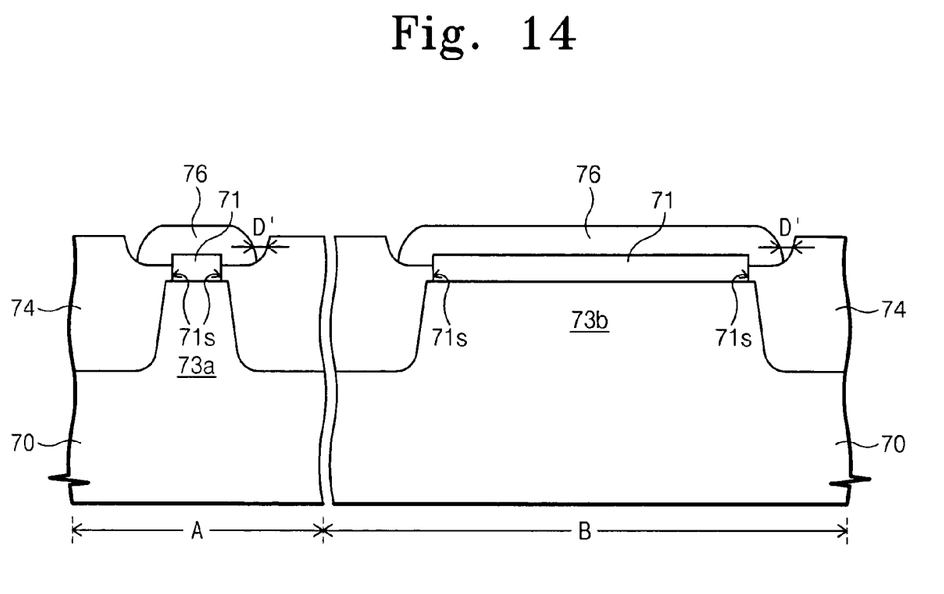

Referring to FIG. 14, an epitaxial layer 76 is grown on the first and second active regions 73a and 73b using a selective epitaxial growth method. The epitaxial layer 76 may be grown vertically and laterally on the first and second active regions 73a and 73b. The epitaxial layer 76 is grown laterally to extend onto an upper portion of the adjacent device isolation layer 74. If a growth portion of the epitaxial layer is in contact with the vertically protruding sidewall 74s of the device isolation layer, a defect may result from compressive stress. Accordingly, in some embodiments of the present invention, the sidewall 74s of the vertically protruding portion of the device isolation layer 74 is spaced apart a distance D' from the epitaxial layer 76.

In particular embodiments of the present invention, the distance D' is sufficiently large so as to reduce and/or minimize stress caused by the formation of the epitaxial layer 76 on the device isolation layer 74. The distance D' should also be large enough to provide isolation of the epitaxial layer from the sidewall 74s of the device isolation layer 74, for example, taking into account manufacturing tolerances. However, in some embodiments of the present invention, the distance D' is not so large as to significantly increase the overall size of the devices.

In some embodiments, a ratio of the dimension of the portion of the epitaxial layer that extends onto the isolation layer and the total dimension of the epitaxial layer is inverse to the dimension of an active region. Therefore, the desired characteristics and, therefore, the dimensions, of a transistor should be taken into account in defining a location of the first and second active regions 73a and 73b. In other words, an active region with a small dimension may be defined in a region where transistors requiring the suppression of short-channel effect will be formed. An active region with a large dimension may be defined in a region where transistors requiring Joule heating dispersion and suppression of floating-body effect will be formed.

Figure 15:
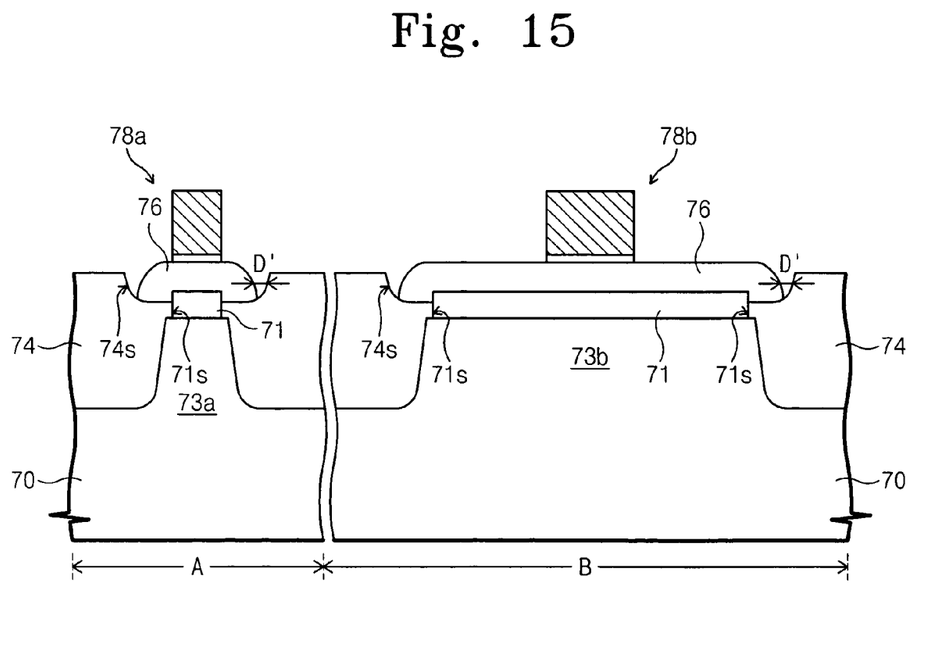

Referring to FIG. 15, a first gate pattern 78a crossing over an epitaxial layer 76 of the first region A is formed, and a second gate pattern 78b crossing over an epitaxial layer 76 of the second region B is formed. In some embodiments of the present invention, the width of the first gate pattern 78a is the same as or wider than that of the first active region 73a. The width of the second gate pattern 78b may be narrower than that of the second active region 73b. The width of the gate patterns 78a and 78b may be closely related to characteristics of the transistors. Accordingly, to provide the desired characteristics of the transistors, the width of the gate patterns 78a and 78b may be established and the first active region 73a may be defined narrower than the first gate pattern 78a and the second active region 73b may be defined wider than the second gate pattern 78b.

Impurities are implanted into the epitaxial layer 76 adjacent the first and second gate patterns 78a and 78b to form first and second source/drains (see 80a and 80b in FIG. 9). To suppress short-channel effect, in some embodiments of the present invention, the lower junction of the first source/drain (see 80b in FIG. 9) contacts only the device isolation layer 74 or a portion of the first source/drain that contacts a region on the device isolation layer 74 that is wider than the portion of the first source/drain that contacts an upper region of the first active region 73a. In addition, to improve Joule heat dispersion and/or suppress floating-body effect, in some embodiments of the present invention, the portion of the second source/drain that contacts the upper region of the second active region 73b is wider than the portion of the second source/drain that contacts the device isolation layer 74 (see 80b in FIG. 9).

Operational characteristics of the transistors may depend on dimensions of the source/drain and the width and length of the gate pattern. Accordingly, to provide transistors with the desired characteristics, the dimensions of the source/drain and the width and length of the gate pattern may be established and the dimensions of the first and second active regions 73a and 73b and the extension of the epitaxial layer 76 onto the device isolation layer 74 defined to provide such dimensions. As a result, it is possible to respectively control a ratio of the portion of the first and second source/drains (see 80a and 70b in FIG. 9) on the device isolation layer 74 to the total size of the first and second source/drains to provide transistors having particular desired characteristics.

As previously mentioned, in some embodiments of the present invention, an epitaxial layer extends onto an upper portion of a device isolation layer on an active region. Source/drain regions are formed on the epitaxial layer over the device isolation layer. As a result, in some embodiments of the present invention, it may be possible to reduce or suppress short-channel effects. Furthermore, according to some embodiments of the present invention, in a transistor with high current driving capacity, Joule heat dispersion may be improved and floating-body effect may be reduced or suppressed. In a transistor requiring suppression of short-channel effects, it may be possible to suppress short-channel effects as well as Joule heating dispersion and/or floating-body effect at the same time.

Furthermore, suppressing short-channel effects, improving Joule heat dispersion and floating-body effects may be adequately controlled depending on a size of a transistor. A ratio of an dimension of an epitaxial layer and a portion of the epitaxial layer on a device isolation layer may be inversely related to the width of an active region. Accordingly, it may be possible to suppress short-channel effects, improve Joule heat dispersion and/or suppress floating-body effects in a transistor with high current driving capacity.

While embodiments of the present invention have been described with reference to two different sizes of active regions, as will be appreciated by those of skill in the art, each of the different size active regions may be provided individually or with other size active regions. Accordingly, embodiments of the present invention may provide combination and/or sub-combinations of devices as illustrated in FIGS. 1 through 15.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A semiconductor device comprising:
 a substrate;
 a device isolation layer in the substrate that defines an active region of the substrate, the device isolation layer having a vertically protruding portion having a sidewall that extends vertically beyond a surface of the substrate;
 an epitaxial layer on the surface of the substrate in the active region and extending onto the device isolation layer, the epitaxial layer being spaced apart from the sidewall of the vertically protruding portion;
 a gate pattern on the epitaxial layer; and
 source/drain regions in the epitaxial layer at opposite sides of the gate pattern;
 wherein the source/drain regions are provided in the epitaxial layer on the active region and the device isolation layer, and wherein an area of a portion of the source/drain regions on the device isolation layer is greater than an area of a portion of the source/drain regions on the active region.

2. The semiconductor device of claim 1, wherein the active region comprises an upper portion and a lower portion, wherein a width of the upper portion is less than a width of the lower portion such that the active region has stepped sidewalls.

3. The semiconductor device of claim 1, wherein the active region comprises an upper portion and a lower portion that provide a hetero-junction therebetween.

4. The semiconductor device of claim 3, wherein a width of the upper portion is less than a width of the lower portion.

5. The semiconductor device of claim 3, wherein the device isolation layer extends onto the lower portion of the active region to a sidewall of the upper portion of the active region.

6. The semiconductor device of claim 5, wherein the sidewall of the upper portion of the active region protrudes beyond a top surface of the device isolation layer adjacent the upper portion of the active region.

7. The semiconductor device of claim 1, wherein the source/drain regions are provided in the epitaxial layer only on the device isolation layer.

8. A semiconductor device comprising:
a substrate;
a device isolation layer in the substrate that defines an active region of the substrate, the device isolation layer having a vertically protruding portion having a sidewall that extends vertically beyond a surface of the substrate;
an epitaxial layer on the surface of the substrate in the active region and extending onto the device isolation layer, the epitaxial layer being spaced apart from the sidewall of the vertically protruding portion;
a gate pattern on the epitaxial layer; and
source/drain regions in the epitaxial layer at opposite sides of the gate pattern;
wherein the source/drain regions are provided in the epitaxial layer on the active region and the device isolation layer, and wherein an area of a portion of the source/drain regions on the device isolation layer is smaller than an area of a portion of the source/drain regions on the active region.

9. A semiconductor device comprising:
a substrate having first and second regions;
a first device isolation layer on the substrate that defines a first active region in the first region and has a vertically protruding portion;
a second device isolation layer on the substrate that defines a second active region in the second region and has a vertically protruding portion;
a first epitaxial layer on the first active region and the first device isolation layer and that is spaced apart from a sidewall of the vertically protruding portion of the first device isolation layer;
a second epitaxial layer on the second active region and the second device isolation layer and that is spaced apart from a sidewall of the vertically protruding portion of the first device isolation layer;
a first gate pattern disposed to cross over the first epitaxial layer at the first region;
a second gate pattern disposed to cross over the second epitaxial layer at the second region;
first source and drain regions in the first epitaxial layer at opposite sides of the first gate pattern on the first device isolation layer adjacent to the first active region; and
second source and drain regions in the second epitaxial layer at opposite sides of the second gate pattern and that extend over the second active region and the second device isolation layer adjacent to the second active region, wherein an area of portions of the second source and drain regions on the second active region is greater than an area of portions of the second source and drain regions on the second device isolation layer.

10. The semiconductor device of claim 9, wherein the first and second active regions of the substrate have sidewalls that protrude beyond the respective first and second device isolation layer adjacent the first and second active regions.

11. The semiconductor device of claim 9, wherein the first source and the first drain regions are provided on the first active region and the first device isolation layer, and wherein an area of a portion of the first source and drain regions on the first device isolation layer is greater than an area of a portion of the first source and drain regions on the first active region.

12. The semiconductor device of claim 9, wherein the first and second active regions each comprise an upper portion and a lower portion,
wherein a width of the upper portion is less than a width of the lower portion such that the first and second active regions have stepped sidewalls.

13. The semiconductor device of claim 9, wherein the first and second active regions each comprise an upper portion and a lower portion that provide a hetero-junction therebetween.

14. The semiconductor device of claim 13, wherein a width of the upper portion is less than a width of the lower portion.

15. The semiconductor device of claim 13, wherein the first and second device isolation layers extend onto the lower portion of the respective first and second active regions to a sidewall of the upper portion of the first and second active regions.

16. The semiconductor device of claim 15, wherein the sidewalls of the upper portion of the first and second active regions protrude beyond a top surface of the respective first and second device isolation layers adjacent the upper portion of the first and second active regions.

17. The semiconductor device of claim 9, wherein the first source and drain regions are provided in the first epitaxial layer only on the first device isolation layer.

18. A semiconductor device comprising:
a substrate;
a device isolation layer in the substrate that defines an active region of the substrate, the device isolation layer extending beyond a surface of the substrate and having a recess adjacent the active region that extends to a depth greater than a distance that the device isolation layer extends beyond the surface of the substrate;
an epitaxial layer on the surface of the substrate in the active region and extending onto the recess in the device isolation layer, the epitaxial layer being spaced apart from at least a portion of a sidewall of the recess;
a gate pattern on the epitaxial layer; and
a source region and a drain region in the epitaxial layer at opposite sides of the gate pattern;
wherein the source region and the drain region are provided in portions of the epitaxial layer on the device isolation layer;
wherein portions of the source region and the drain region are also provided in portions of the epitaxial layer on the active region of the substrate; and wherein the portions of the source region and the drain region provided in portions of the epitaxial layer on the active region have a smaller area than portions of the source region and the drain region provided in portions of the epitaxial layer on the device isolation layer.

19. A semiconductor device comprising:
  a substrate;
  a device isolation layer in the substrate that defines an active region of the substrate, the device isolation layer extending beyond a surface of the substrate and having a recess adjacent the active region that extends to a depth greater than a distance that the device isolation layer extends beyond the surface of the substrate;
  an epitaxial layer on the surface of the substrate in the active region and extending onto the recess in the device isolation layer, the epitaxial layer being spaced apart from at least a portion of a sidewall of the recess;
a gate pattern on the epitaxial layer; and
  source region and a drain region in the epitaxial layer at opposite sides of the gate pattern;
  wherein the source region and the drain region are provided in portions of the epitaxial layer on the device isolation layer;
  wherein portions of the source region and the drain region are also provided in portions of the epitaxial layer on the active region of the substrate; and
wherein the portions of the source region and the drain region provided in portions of the epitaxial layer on the active region have a larger area than portions of the source region and the drain region provided in portions of the epitaxial layer on the device isolation layer.

20. A field effect transistor, comprising:
  a semiconductor substrate having a trench therein;
  a semiconductor layer extending directly on a surface of said semiconductor substrate and forming a heterojunction therewith, said semiconductor layer having a sidewall that is recessed laterally relative to a sidewall of the trench;
  an electrically insulating isolation layer that extends in the trench and contacts a first portion of the sidewall of said semiconductor layer that is recessed relative to the sidewall of the trench;
  a semiconductor epitaxial layer that extends on an upper surface of said semiconductor layer and directly contacts a second portion of the sidewall of said semiconductor layer that is recessed laterally relative to the sidewall of the trench, said semiconductor epitaxial layer having source and drain regions therein that extend into said semiconductor layer; and
  an insulated gate electrode on said semiconductor epitaxial layer.

21. The field effect transistor of claim 20, wherein said semiconductor layer is a silicon-germanium layer; and wherein said semiconductor epitaxial layer is a silicon layer that forms a heterojunction with said semiconductor layer.

22. A semiconductor device comprising:
  a semiconductor substrate having first and second trenches therein that define a semiconductor active region therebetween having an upper surface thereon;
  first and second device isolation layers that extend in the first and second trenches, respectively, and protrude vertically relative to the upper surface of the semiconductor active region;
  an epitaxial layer that extends on the upper surface of the semiconductor active region, contacts portions of the first and second device isolation layers that are recessed vertically relative to the upper surface of the semiconductor active region and contacts portions of sidewalls of the first and second trenches that protrude vertically relative to the first and second device isolation layers;
  a gate pattern on said epitaxial layer; and
  source and drain regions in said epitaxial layer, at opposite sides of the gate pattern.

23. The semiconductor device of claim 22, wherein portions of the first and second device isolation layers that protrude vertically relative to the upper surface of the semiconductor active region are spaced apart from said epitaxial layer.

* * * * *